(12) United States Patent
Zha

(10) Patent No.: US 10,840,304 B2
(45) Date of Patent: Nov. 17, 2020

(54) CIRCULAR POLARIZER AND DISPLAY

(71) Applicant: Wuhan China Star Optoelectronics Technology Co., Ltd., Hubei (CN)

(72) Inventor: Guowei Zha, Hubei (CN)

(73) Assignee: WUHAN CHINA STAR OPTOELECTRONICS TECHNOLOGY CO., LTD., Wuhan (CN)

( * ) Notice: Subject to any disclaimer, the term of this patent is extended or adjusted under 35 U.S.C. 154(b) by 240 days.

(21) Appl. No.: 15/741,138

(22) PCT Filed: Dec. 18, 2017

(86) PCT No.: PCT/CN2017/116840
§ 371 (c)(1),
(2) Date: Sep. 27, 2018

(87) PCT Pub. No.: WO2019/015244
PCT Pub. Date: Jan. 24, 2019

(65) Prior Publication Data
US 2019/0027541 A1  Jan. 24, 2019

(30) Foreign Application Priority Data
Jul. 19, 2017 (CN) .......................... 2017 1 0592649

(51) Int. Cl.
*H01L 27/32* (2006.01)
*H01L 51/30* (2006.01)
(Continued)

(52) U.S. Cl.
CPC ........ *H01L 27/3211* (2013.01); *G02B 5/3025* (2013.01); *H01L 27/3276* (2013.01); *H01L 51/5271* (2013.01); *H01L 51/5281* (2013.01)

(58) Field of Classification Search
CPC ................ G02B 5/3025; G02B 5/3058; G02F 1/133528; G02F 1/133536; G02F 1/13363;
(Continued)

(56) References Cited

U.S. PATENT DOCUMENTS

2017/0017027 A1* 1/2017 Tsuruoka .......... G02F 1/133788
2017/0371202 A1* 12/2017 He ..................... G02F 1/133528
(Continued)

FOREIGN PATENT DOCUMENTS

| CN | 106068469 A | 11/2016 |
|---|---|---|
| CN | 106125185 A | 11/2016 |

*Primary Examiner* — William R Alexander
*Assistant Examiner* — Ephrem Z Mebrahtu
(74) *Attorney, Agent, or Firm* — Hemisphere Law, PLLC; Zhigang Ma

(57) ABSTRACT

The present disclosure provides a circular polarizer for use on a display including a transparent substrate disposed on the display and a plurality of strip dielectric wire grids disposed on the transparent substrate; each dielectric wire grid is provided with a wire grid array formed by a plurality of wire grids, and each of the dielectric wire grids respectively corresponds to a region above one of R sub-pixel unit, G sub-pixel unit and B sub-pixel unit of the display and has a corresponding thickness, so that each of the dielectric wire grids forms a quarter-phase delay on the sub-pixel units of the corresponding display. The implementation of the disclosure can solve the problem that the traditional organic phase retarder can not achieve the wide circular partial effect, and improve the visual effect.

16 Claims, 2 Drawing Sheets

(51) Int. Cl.
 G02B 5/30 (2006.01)
 H01L 51/52 (2006.01)
(58) Field of Classification Search
 CPC ............. H01L 27/3211; H01L 27/3276; H01L 51/5271; H01L 51/5281
 See application file for complete search history.

(56) References Cited

U.S. PATENT DOCUMENTS

2018/0196308 A1* 7/2018 Xu .................... G02F 1/133514
2020/0136094 A1* 4/2020 Yoon ....................... C08L 33/12

* cited by examiner

US 10,840,304 B2

CIRCULAR POLARIZER AND DISPLAY

RELATED APPLICATIONS

The present application is a National Phase of International Application Number PCT/CN2017/116840, filed Dec. 18, 2017, and claims the priority of China Application CN 201710592649.0, filed Jul. 19, 2017.

FIELD OF THE DISCLOSURE

The present disclosure relates to a touch screen technology field, and more particularly to a circular polarizer and a display.

BACKGROUND OF THE DISCLOSURE

The current mainstream display technologies include liquid crystal display and OLED (organic light-emitting diode) display. However, the phase retardation of light exists in both of the above mainstream display technologies. Therefore, the liquid crystal display realizes the light valve function through the combination of the polarization adjusting property of the liquid crystal. In the OLED structure, a linear polarizer and a quarter slide are generally used to suppress the ambient light reflections, so as to enhance the display contrast in the outdoor environment (as shown in FIG. 1). It can be seen that the polarizer is an indispensable part of the current OLED display technology and includes a linear polarizer and a circular polarizer.

The traditional linear polarizer is mainly prepared based on organic materials, with the advantages of mature technology, large area preparation and good uniformity. However, the disadvantage is that due to the mechanical and optical instability of organic materials, the linear polarizer gradually deviates from the ideal state with the change of the external environment (such as temperature, humidity, air composition) and the extension of the use time, and the uniformity, the mechanical deformation, the optical transmittance change or the chromaticity difference and the like appear.

As shown in FIG. 2, the basic principle of realizing the circular polarizer is to superimpose a quarter slide on the basis of the linear polarizer so as to convert the linearly polarized light into circularly polarized light. Obviously, the quarter slide principle is to achieve a quarter-wave retardation of light, but the display actually covers the wavelengths 380-780 nm different wavelengths of light, such as red R, green G, blue B and other light. Therefore, it is difficult to cover the entire visible light band only when the phase delay is satisfied at a specific wavelength. The current more common approach is to make the linear polarization around 550 nm into circularly polarized light, the rest of the wavelength is converted to elliptically polarized light. Obviously, there is still a big difference between the final display's output light and the completely unpolarized light of nature, which has a great impact on the visual health of the human eye.

SUMMARY OF THE DISCLOSURE

The technical problem to be solved in the embodiments of the present disclosure is to provide a circular polarizer and a display, so as to solve the problem that the conventional organic phase retarder can not achieve the wide circular partial deflection effect and improve the visual effect.

In order to solve the above technical problem, the embodiment of the present disclosure provides a circular polarizer for use on a display including a transparent substrate disposed on the display and a plurality of strip dielectric wire grids disposed on the transparent substrate; wherein, each dielectric wire grid is provided with a wire grid array formed by a plurality of wire grids, and each of the dielectric wire grids respectively corresponds to a region above one of R sub-pixel unit, G sub-pixel unit and B sub-pixel unit of the display and has a corresponding thickness, so that each of the dielectric wire grids forms a quarter-phase delay on the sub-pixel units of the corresponding display.

Wherein the thickness of each dielectric wire grid is determined by a reference incident wavelength of the sub-pixel unit corresponding to the display and a refractive index difference formed by a horizontal polarization and a vertical polarization corresponding to an incident light; wherein the horizontally polarized refractive index is a refractive index of the incident light in a Bloch wave TM mode, and the perpendicularly polarized refractive index is a refractive index of the incident light in a Bloch wave TE mode.

Wherein the wire grid of the wire grid array on each dielectric wire grid is a wire grid with a same material, a same period and a same duty ratio.

Wherein the period of the wire grid is between 100 nm and 700 nm; and the duty ratio of the wire grid is between 0.1 and 0.9.

Wherein each of the dielectric wire grids further includes a dielectric layer located between the corresponding wire grid array and the transparent substrate.

Wherein each dielectric layer is made of any one of polymethylmethacrylate PMMA, $SiO_2$, SiO, MgO, $Si_3N_4$, $TiO_2$, $Ta_2O_5$.

Wherein the thickness of each of the dielectric wire grids is calculated by a formula $d=\lambda/(4*\Delta n)$; where d is the thickness of each dielectric wire grid; $\lambda$ is a reference incident wavelength of each sub-pixel unit of the display corresponding to each dielectric wire grid; $\Delta n$ is the refractive index difference formed by the horizontal polarization and the vertical polarization of incident light corresponding to each dielectric wire grid, and takes an absolute value.

Wherein the thickness of each dielectric wire grid is between 0.1 μm and 10 μm.

Wherein a reference incident wavelength of the R sub-pixel unit of the display is 630 nm, a reference incident wavelength of the G sub-pixel unit of the display is 550 nm, and a reference incident wavelength of the B sub-pixel unit of the display is 450 nm.

Correspondingly, the embodiment of the present disclosure further provides another circular polarizer for use on a display including a transparent substrate disposed on the display and a plurality of strip dielectric wire grids disposed on the transparent substrate; wherein, each dielectric wire grid is provided with a wire grid array formed by a plurality of wire grids, and each of the dielectric wire grids respectively corresponds to a region above one of R sub-pixel unit, G sub-pixel unit and B sub-pixel unit of the display and has a corresponding thickness, so that each of the dielectric wire grids forms a quarter-phase delay on the sub-pixel units of the corresponding display; wherein the wire grid of the wire grid array on each dielectric wire grid is a wire grid with a same material, a same period and a same duty ratio.

Wherein the thickness of each dielectric wire grid is determined by a reference incident wavelength of the sub-pixel unit corresponding to the display and a refractive index difference formed by a horizontal polarization and a vertical polarization corresponding to an incident light; wherein the horizontally polarized refractive index is a refractive index of the incident light in a Bloch wave TM mode, and the perpendicularly polarized refractive index is a refractive index of the incident light in a Bloch wave TE mode.

Wherein the period of the wire grid is between 100 nm and 700 nm; and the duty ratio of the wire grid is between 0.1 and 0.9.

Correspondingly, the embodiment of the present disclosure further provides a display including a main body and a circular polarizer disposed on the main body; wherein,
R sub-pixel units, G sub-pixel units and B sub-pixel units are formed on the main body, and each R sub-pixel unit, each G sub-pixel unit and each B sub-pixel unit correspond to a dielectric wire grid having a corresponding thickness on the circular polarizer;
the circular polarizer includes a transparent substrate disposed on the main body and a plurality of strip dielectric wire grids disposed on the transparent substrate; wherein, each dielectric wire grid is provided with a wire grid array formed by a plurality of wire grids, and each of the dielectric wire grids respectively corresponds to a region above one of the R sub-pixel unit, the G sub-pixel unit and the B sub-pixel unit of the display and has a corresponding thickness, so that each of the dielectric wire grids forms a quarter-phase delay on the sub-pixel units of the corresponding display.

Wherein the thickness of each dielectric wire grid is determined by a reference incident wavelength of the sub-pixel unit corresponding to the display and a refractive index difference formed by a horizontal polarization and a vertical polarization corresponding to an incident light; wherein the horizontally polarized refractive index is a refractive index of the incident light in a Bloch wave TM mode, and the perpendicularly polarized refractive index is a refractive index of the incident light in a Bloch wave TE mode.

Wherein the wire grid of the wire grid array on each dielectric wire grid is a wire grid with a same material, a same period and a same duty ratio.

Wherein the period of the wire grid is between 100 nm and 700 nm; and the duty ratio of the wire grid is between 0.1 and 0.9.

Wherein each of the dielectric wire grids further includes a dielectric layer located between the corresponding wire grid array and the transparent substrate.

Wherein each dielectric layer is made of any one of polymethylmethacrylate PMMA, $SiO_2$, SiO, MgO, $Si_3N_4$, $TiO_2$, $Ta_2O_5$.

Wherein the thickness of each of the dielectric wire grids is calculated by a formula $d=\lambda/(4*\Delta n)$; where d is the thickness of each dielectric wire grid; $\lambda$ is a reference incident wavelength of each sub-pixel unit of the display corresponding to each dielectric wire grid; $\Delta n$ is the refractive index difference formed by the horizontal polarization and the vertical polarization of incident light corresponding to each dielectric wire grid, and takes an absolute value.

Wherein the thickness of each dielectric wire grid is between 0.1 μm and 10 μm.

In summary, in the embodiment of the present disclosure, the thickness of the different dielectric wire grids is set according to the different R/G/B sub-pixel units of the display such that the phase delay effect of the dielectric wire grid can provide a quarter-phase delay to the corresponding display R/G/B sub-pixel unit area, the disclosure realizes the purpose of circularly polarizing the three colors of R/G/B, not only omitting the traditional quarter-slide, but also simultaneously solving the problem that the traditional organic-phase retarder can not achieve the broad-spectrum circularly-polarized effect, and improving the visual effect.

BRIEF DESCRIPTION OF THE DRAWINGS

To describe the technical solutions in the embodiments of the present disclosure or in the prior art more clearly, the following briefly introduces the accompanying drawings required for describing the embodiments or the prior art. Apparently, the accompanying drawings in the following description show merely some embodiments of the present disclosure, for those skilled in the art, other drawings based on these drawings are still within the scope of the present disclosure without any creative efforts.

DETAILED DESCRIPTION OF PREFERRED EMBODIMENTS

The preferred embodiments of the present disclosure are described below with reference to the accompanying drawings.

Figure 1:
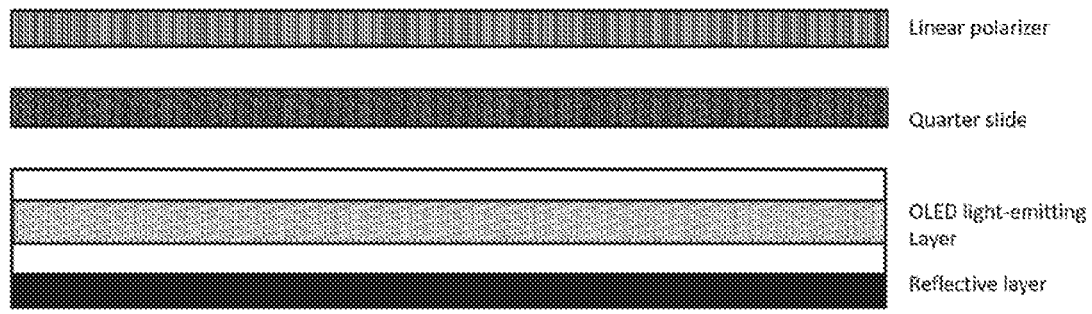
FIG. 1 is a schematic structural diagram of an OLED used to solve the phenomenon of optical phase delay in the prior art.
Figure 2:
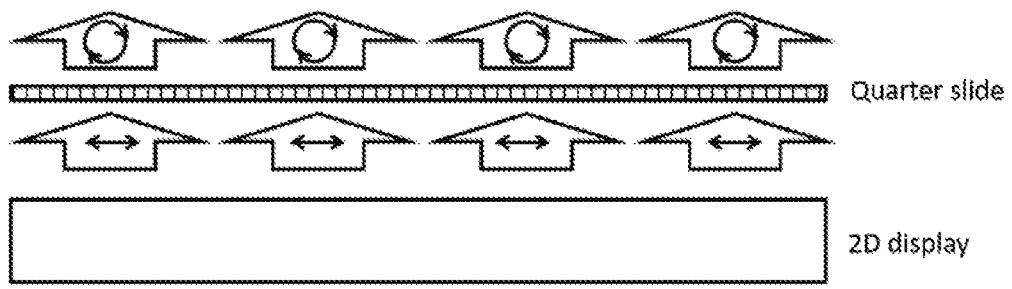
FIG. 2 is a schematic structural diagram of the prior art circular polarizer.
Figure 3:
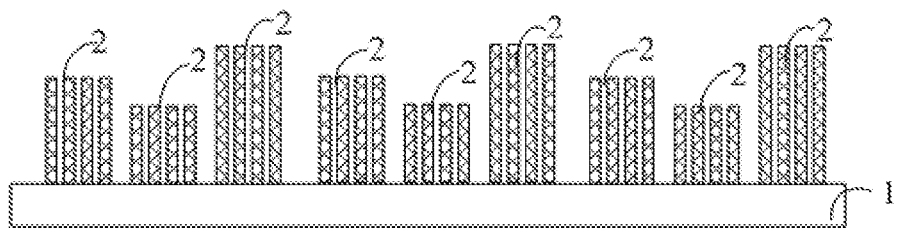
FIG. 3 is a cross-sectional view of the circular polarizer structure according to Embodiment 1 of the present disclosure.

As shown in FIG. 3, a circular polarizer provided in Embodiment 1 of the present disclosure for a display (not shown), including a transparent substrate 1 disposed on the display and a plurality of strip dielectric wire grids 2 disposed on the transparent substrate 1; wherein, each dielectric wire grid 2 is provided with a wire grid array formed by a plurality of wire grids, and each of the dielectric wire grids 2 respectively corresponds to a region above one of R sub-pixel unit, G sub-pixel unit and B sub-pixel unit of the display and has a corresponding thickness, so that each of the dielectric wire grids 2 forms a quarter-phase delay on the sub-pixel units of the corresponding display.

Wherein the thickness of each dielectric wire grid 2 is determined by a reference incident wavelength of the sub-pixel unit corresponding to the display and a refractive index difference formed by a horizontal polarization and a vertical polarization corresponding to an incident light; wherein the horizontally polarized refractive index is a refractive index of the incident light in a Bloch wave TM mode, and the perpendicularly polarized refractive index is a refractive index of the incident light in a Bloch wave TE mode.

It should be noted that each dielectric wire grid 2 is formed by a microelectronic process at different thicknesses for different R/G/B sub-pixel unit regions of the display respectively.

In Embodiment 1 of the present disclosure, in order to not only omit the traditional quarter slide, but also solve the problem that the traditional organic phase retarder can not achieve the wide circular deflection effect, the quarter-phase retardation is provided by the phase retarder of the dielectric wire grid 2 to achieve a circular polarization effect on R/G/B three colors. However, the phase delay of the dielectric wire grid 2 can be achieved by adjusting the thickness of the dielectric wire grid 2 and the refractive index difference.

The refractive index difference is that when the period of the wire grid in the wire grid array included in the dielectric wire grid 2 is less than one half of the wavelength of the incident light, the incident light is biased to a Bloch wave so formed that it supports a different index of refraction (i.e. birefringence) in the Bloch wave TM mode (polarization direction parallel to the wire grid direction) and the TE mode (polarization direction perpendicular to the wire grid direction). In order to realize the compatibility of the process, the wire grid of the wire grid array on the dielectric wire grid 2 is usually adopted in the whole structure with the wire grid of the same material, the same period and the same duty ratio. The index of refraction is the same for each dielectric wire grid 2 so that the phase delay effect of the dielectric wire grid 2 can be achieved as long as the thickness of each dielectric wire grid 2 is controlled.

In order to achieve a quarter-phase delay effect, the thickness of each of the dielectric wire grids 2 is calculated by a formula $d=\lambda/(4*\Delta n)$; where d is the thickness of each dielectric wire grid 2; $\lambda$ is a reference incident wavelength of each sub-pixel unit of the display corresponding to each dielectric wire grid 2; $\Delta n$ is the refractive index difference between the refractive index in the Bloch wave TM mode and the refractive index in the Bloch wave TE mode, and takes an absolute value.

Wherein the period of the wire grid is between 100 nm and 700 nm; and the duty ratio of the wire grid is between 0.1 and 0.9; the wire grids made of aluminum, silver or copper and other metals; the reference incident wavelength of the R sub-pixel unit of the display is 630 nm, the reference incident wavelength of the G sub-pixel unit of the display is 550 nm, the reference incident wavelength of the B sub-pixel unit of the display is 450 nm and the thickness of each dielectric wire grid 2 is between 0.1 μm and 10 μm.

Of course, each dielectric wire grid 2 further includes a dielectric layer located between its corresponding wire grid array and the transparent substrate 1. The dielectric layer serves to improve the refractive index of the dielectric wire grid 2, wherein each dielectric layer is made of any one of PMMA, $SiO_2$, SiO, MgO, $Si_3N_4$, $TiO_2$, $Ta_2O_5$.

Figure 4:
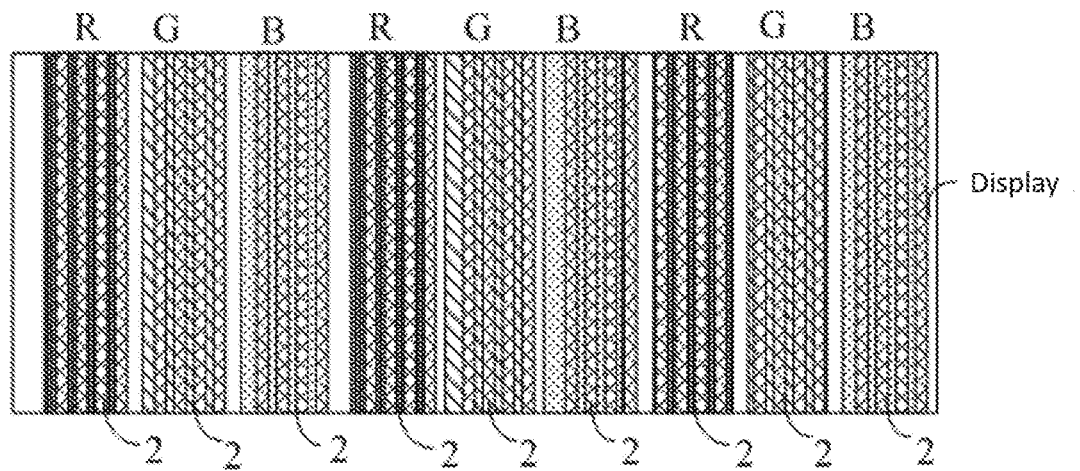
FIG. 4 is a plan view of the circular polarizer applied to the display according to Embodiment 1 of the present disclosure.
Figure 5:
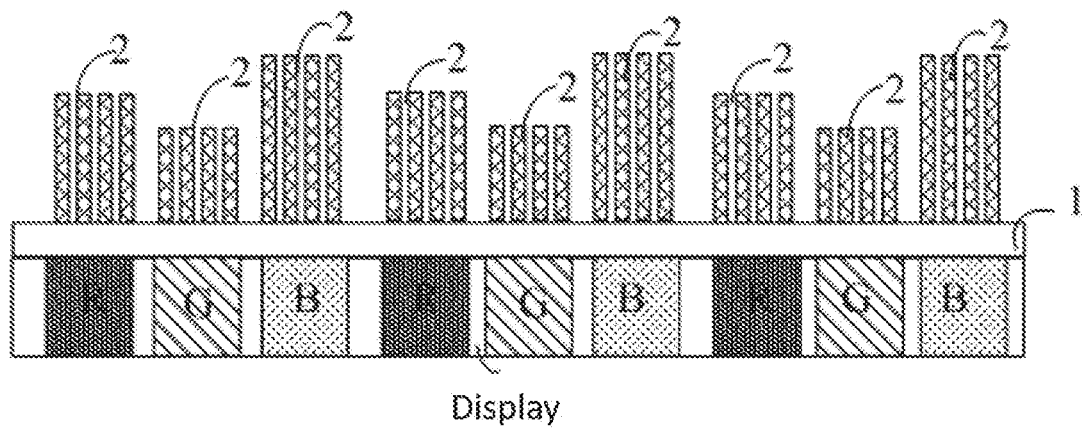
FIG. 5 is a front sectional view of FIG. 4.

As shown in FIG. 3 and FIG. 4, are application scene diagrams of a circular polarizer according to Embodiment 1 of the present disclosure applied to a display. It can be seen from FIG. 4 that the dielectric wire grid 2 also has a different thickness for the different R/G/B sub-pixel unit regions of the display.

Corresponding to the circular polarizer in Embodiment 1 of the present disclosure, Embodiment 2 of the present disclosure further provides a display. The display includes a main body and a circular polarizer disposed on the main body and having the same structure and connection relationship as Embodiment 1 of the present disclosure; wherein, R sub-pixel units, G sub-pixel units and B sub-pixel units are formed on the main body, and each R sub-pixel unit, each G sub-pixel unit and each B sub-pixel unit correspond to a dielectric wire grid having a corresponding thickness on the circular polarizer.

t can be understood that since the circular polarizer included in the display in Embodiment 2 of the present disclosure has the same structure and connection relationship with the circular polarizer in Embodiment 1 of the present disclosure. Therefore, reference may be made to the related content in Embodiment 1 of the present disclosure, and details are not described herein again.

In summary, in the embodiment of the present disclosure, the thickness of the different dielectric wire grids is set according to the different R/G/B sub-pixel units of the display such that the phase delay effect of the dielectric wire grid can provide a quarter-phase delay to the corresponding display R/G/B sub-pixel unit area, the disclosure realizes the purpose of circularly polarizing the three colors of R/G/B, not only omitting the traditional quarter-slide, but also simultaneously solving the problem that the traditional organic-phase retarder can not achieve the broad-spectrum circularly-polarized effect, and improving the visual effect.

The foregoing disclosure is merely a preferred embodiment of the present disclosure, and certainly can not be used to limit the scope of the present disclosure. Therefore, equivalent changes made according to the claims of the present disclosure are still within the scope of the present disclosure.

What is claimed is:

1. A circular polarizer for use on a display comprising a transparent substrate disposed on the display and a plurality of strip dielectric wire grids disposed on the transparent substrate; wherein, each dielectric wire grid is provided with a wire grid array formed by a plurality of wire grids, and each of the dielectric wire grids respectively corresponds to a region above one of R sub-pixel unit, G sub-pixel unit and B sub-pixel unit of the display and has a corresponding thickness, so that each of the dielectric wire grids forms a quarter-phase delay on the sub-pixel units of the corresponding display;

wherein the thickness of each dielectric wire grid is determined by a reference incident wavelength of the sub-pixel unit corresponding to the display and a refractive index difference formed by a horizontal polarization and a vertical polarization corresponding to an incident light; wherein the horizontally polarized refractive index is a refractive index of the incident light in a Bloch wave TM mode, and the perpendicularly polarized refractive index is a refractive index of the incident light in a Bloch wave TE mode.

2. The circular polarizer according to claim 1, wherein the wire grid of the wire grid array on each dielectric wire grid is a wire grid with a same material and a same period.

3. The circular polarizer according to claim 2, wherein the period of the wire grid is between 100 nm and 700 nm.

4. The circular polarizer according to claim 3, wherein each of the dielectric wire grids further comprises a dielectric layer located between the corresponding wire grid array and the transparent substrate.

5. The circular polarizer according to claim 4, wherein each dielectric layer is made of any one of polymethylmethacrylate PMMA, $SiO_2$, SiO, MgO, $Si_3N_4$, $TiO_2$, $Ta_2O_5$.

6. The circular polarizer according to claim 5, wherein the thickness of each of the dielectric wire grids is calculated by a formula $d=\lambda/(4*\Delta n)$; where d is the thickness of each dielectric wire grid; $\lambda$ is a reference incident wavelength of each sub-pixel unit of the display corresponding to each dielectric wire grid; $\Delta n$ is the refractive index difference formed by the horizontal polarization and the vertical polarization of incident light corresponding to each dielectric wire grid, and takes an absolute value.

7. The circular polarizer according to claim 6, wherein the thickness of each dielectric wire grid is between 0.1 μm and 10 μm.

8. The circular polarizer according to claim 7, wherein a reference incident wavelength of the R sub-pixel unit of the display is 630 nm, a reference incident wavelength of the G sub-pixel unit of the display is 550 nm, and a reference incident wavelength of the B sub-pixel unit of the display is 450 nm.

9. A circular polarizer for use on a display comprising a transparent substrate disposed on the display and a plurality of strip dielectric wire grids disposed on the transparent substrate; wherein, each dielectric wire grid is provided with a wire grid array formed by a plurality of wire grids, and each of the dielectric wire grids respectively corresponds to a region above one of R sub-pixel unit, G sub-pixel unit and B sub-pixel unit of the display and has a corresponding thickness, so that each of the dielectric wire grids forms a quarter-phase delay on the sub-pixel units of the corresponding display;

wherein the wire grid of the wire grid array on each dielectric wire grid is a wire grid with a same material;

wherein the thickness of each dielectric wire grid is determined by a reference incident wavelength of the sub-pixel unit corresponding to the display and a refractive index difference formed by a horizontal polarization and a vertical polarization corresponding to an incident light wherein the horizontally polarized refractive index is a refractive index of the incident light in a Bloch wave TM mode, and the perpendicularly polarized refractive index is a refractive index of the incident light in a Bloch wave TE mode.

10. A display, comprising a main body and a circular polarizer disposed on the main body; wherein, R sub-pixel units, G sub-pixel units and B sub-pixel units are formed on the main body, and each R sub-pixel unit, each G sub-pixel unit and each B sub-pixel unit correspond to a dielectric wire grid having a corresponding thickness on the circular polarizer;

the circular polarizer comprises a transparent substrate disposed on the main body and a plurality of strip dielectric wire grids disposed on the transparent substrate; wherein, each dielectric wire grid is provided with a wire grid array formed by a plurality of wire grids, and each of the dielectric wire grids respectively corresponds to a region above one of the R sub-pixel unit, the G sub-pixel unit and the B sub-pixel unit of the display and has a corresponding thickness, so that each of the dielectric wire grids forms a quarter-phase delay on the sub-pixel units of the corresponding display;

wherein the thickness of each dielectric wire grid is determined by a reference incident wavelength of the sub-pixel unit corresponding to the display and a refractive index difference formed by a horizontal polarization and a vertical polarization corresponding to an incident light wherein the horizontally polarized refractive index is a refractive index of the incident light in a Bloch wave TM mode, and the perpendicularly polarized refractive index is a refractive index of the incident light in a Bloch wave TE mode.

11. The display according to claim 10, wherein the wire grid of the wire grid array on each dielectric wire grid is a wire grid with a same material and a same period.

12. The display according to claim 11, wherein the period of the wire grid is between 100 nm and 700 nm.

13. The display according to claim 12, wherein each of the dielectric wire grids further comprises a dielectric layer located between the corresponding wire grid array and the transparent substrate.

14. The display according to claim 13, wherein each dielectric layer is made of any one of polymethylmethacrylate PMMA, $SiO_2$, SiO, MgO, $Si_3N_4$, $TiO_2$, $Ta_2O_5$.

15. The display according to claim 14, wherein the thickness of each of the dielectric wire grids is calculated by a formula $d=\lambda/(4*\Delta n)$; where d is the thickness of each dielectric wire grid; $\lambda$ is a reference incident wavelength of each sub-pixel unit of the display corresponding to each dielectric wire grid; $\Delta n$ is the refractive index difference formed by the horizontal polarization and the vertical polarization of incident light corresponding to each dielectric wire grid, and takes an absolute value.

16. The display according to claim 15, wherein the thickness of each dielectric wire grid is between 0.1 μm and 10 μm.

* * * * *